(12) United States Patent
Shen et al.

(10) Patent No.: US 7,639,053 B2
(45) Date of Patent: Dec. 29, 2009

(54) SPREAD SPECTRUM CLOCK GENERATOR WITH LOW JITTER

(75) Inventors: Ding-Shiuan Shen, Chiayi (TW); Shao-Ku Kao, Taipei (TW); Shen-Iuan Liu, Taipei (TW); Chia-Liang Lai, Changhua (TW)

(73) Assignee: Faraday Technology Corporation, Hsinchu (TW)

( * ) Notice: Subject to any disclaimer, the term of this patent is extended or adjusted under 35 U.S.C. 154(b) by 0 days.

(21) Appl. No.: 12/134,307

(22) Filed: Jun. 6, 2008

(65) Prior Publication Data

US 2008/0303566 A1    Dec. 11, 2008

(30) Foreign Application Priority Data

Jun. 8, 2007    (TW)    ............................... 96120889 A

(51) Int. Cl.
    *H03L 7/06*    (2006.01)
(52) U.S. Cl. ........................ 327/158; 327/115; 327/117
(58) Field of Classification Search ................. 327/158, 327/115, 117
    See application file for complete search history.

*Primary Examiner*—Lincoln Donovan
*Assistant Examiner*—Ryan C Jager
(74) *Attorney, Agent, or Firm*—WPAT, PC; Justin King (57) ABSTRACT

A spread spectrum clock generator includes: a phase frequency detector, for generating a phase difference signal according to a frequency divided signal and a reference signal with a reference frequency; a charge pump, for receiving the phase difference signal and generating an output current according to the phase difference signal; a loop filter, for receiving the output current and converting the output current to a voltage-controlled signal; a voltage-controlled oscillator, for receiving the voltage-controlled signal and generating a plurality of voltage-controlled output signals, wherein the plurality of voltage-controlled signals have a specific phase difference and a same voltage-controlled frequency; a frequency dividing unit, for receiving the plurality of voltage-controlled output signal and generating the frequency divided signal; and a delta-sigma modulator, for controlling the frequency dividing unit to have an equivalent divided value of $(N+b)S+(N-a)(P-S)$ through receiving the frequency divided signal and a control word; wherein N, P, and S are integers, and a, b are fractional numbers, and S can be adjusted by the delta-sigma modulator.

7 Claims, 6 Drawing Sheets

SPREAD SPECTRUM CLOCK GENERATOR WITH LOW JITTER

FIELD OF THE INVENTION

The present invention relates to a clock generator, and more particularly to a spread spectrum clock generator with low jitter.

BACKGROUND OF THE INVENTION

Figure 1A:
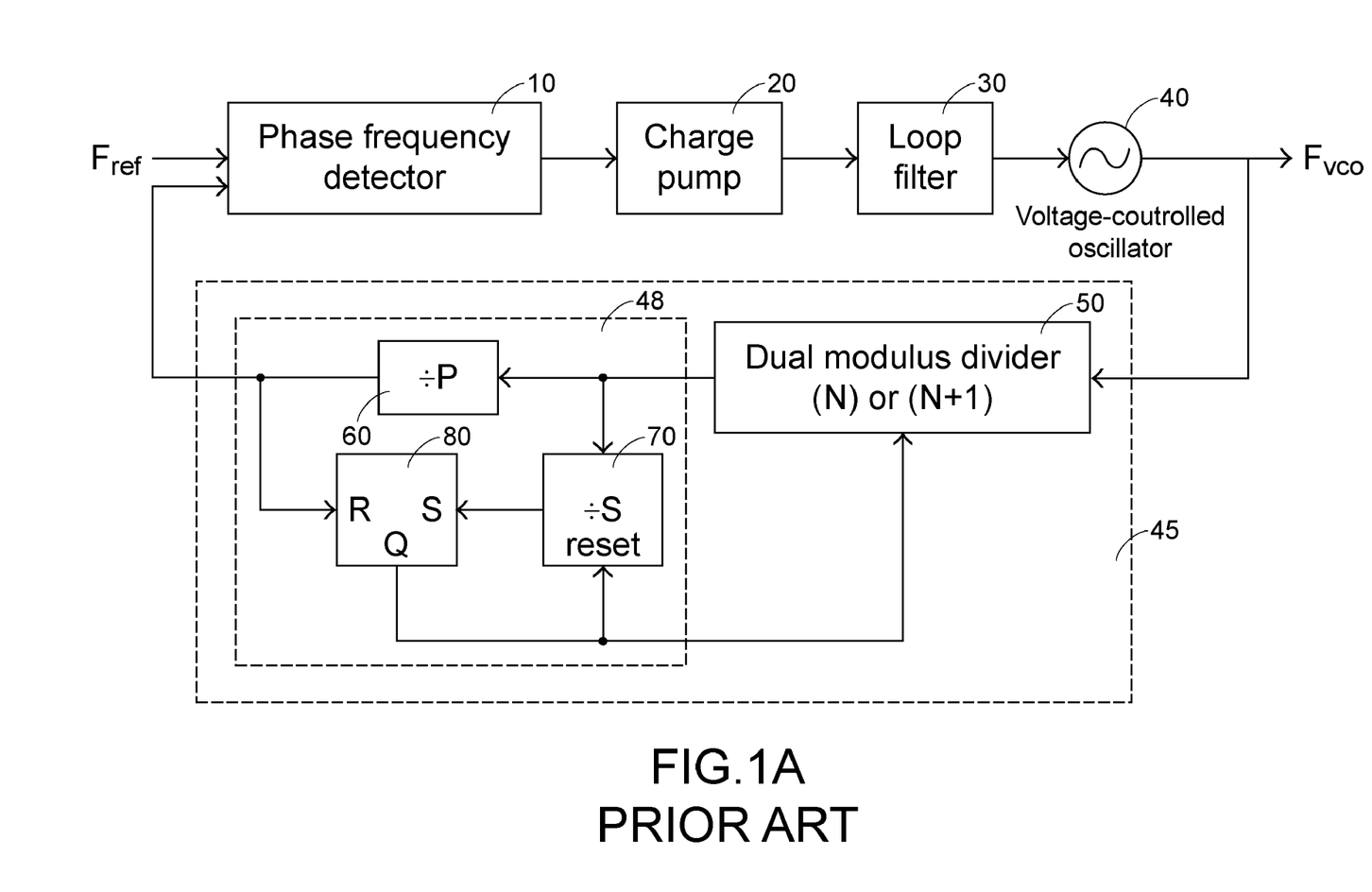
FIG. 1A is a schematic diagram showing a conventional fractional-N PLL (phase-locked loop circuit)

FIG. 1A is a schematic diagram showing a conventional fractional-N PLL (phase-locked loop circuit). The fractional-N PLL includes: a phase frequency detector 10, a charge pump 20, a loop filter 30, a voltage-controlled oscillator 40, and a frequency dividing unit 45.

Firstly, a reference signal with a reference frequency $F_{ref}$ is derived from a reference oscillator (not shown). The reference signal and a frequency divided signal derived from the frequency dividing unit 45 are simultaneously inputted to the phase frequency detector 10. A phase difference signal is derived from the phase frequency detector 10 in response to the phase frequency detector 10 detecting the differences of the phase and frequency between the reference signal and the frequency divided signal, and the phase difference signal is further inputted to the charge pump 20. An output current is derived from the charge pump 20 according to the magnitude of the phase difference signal, and the output current is further inputted to the loop filter 30. The output current is smoothed by the loop filter 30 and converted to a voltage-controlled signal, and the voltage-controlled signal is further inputted to the voltage-controlled oscillator 40. A voltage-controlled output signal with a voltage-controlled frequency $F_{vco}$ is derived from the voltage-controlled oscillator 40 according to the voltage-controlled signal.

The frequency dividing unit 45 further includes: a dual modulus divider 50 and a frequency dividing circuit 48. The frequency dividing circuit 48 further includes: a first frequency divider 60, a second frequency divider 70, and a RS Flip-Flop 80. The dual modulus divider 50, also called prescaled divider, functions to receive the voltage-controlled output signal having the voltage-controlled frequency $F_{vco}$ and divide the voltage-controlled frequency $F_{vco}$ by (N+1) or N accordingly to the logic level asserted at the control terminal of the dual modulus divider 50, wherein N is an integer. The control terminal of the dual modulus divider 50 is connected to the output terminal (Q) of the RS Flip-Flop 80, in other words, the divided value N or (N+1) adopted by the dual modulus divider 50 for dividing the voltage-controlled frequency $F_{vco}$ is determined by the logic level of the signal derived from the output terminal (Q) of the RS Flip-Flop 80. The signal derived from the dual modulus divider 50 is inputted to the first frequency divider 60 and the second frequency divider 70 of the frequency dividing circuit 48. The first frequency divider 60, also called program counter, functions to divide the frequency of the signal derived from the dual modulus divider 50 by P, and output the frequency divided signal to the reset terminal (R) of the RS Flip-Flop 80; the second frequency divider 70, also called swallow counter, functions to divide the frequency of the signal derived from the dual modulus divider 50 by S, and output the signal derived from the second divider 70 to the set terminal (S) of the RS Flip-Flop 80, wherein P, S are integers and P is greater than S. The output terminal (Q) of the RS Flip-Flop 80 is connected to the reset terminal (reset) of the second frequency divider 70.

In one period of the P cycles (cycle number 1 to cycle number P) of the signal derived from the dual modulus divider 50, the divided value of the dual modulus divider 50 will be (N+1) between the cycle number 1 to cycle number S due to a logic-low signal is asserted at the output terminal (Q) of the RS Flop-Flop 80 in response to the set terminal (S) of the RS Flip-Flop 80 is not set by the second frequency divider 70; the divided value of the dual modulus divider 50 will be N between the cycle number (S+1) to cycle number P due to a logic-high signal is assert at the output terminal (Q) of the RS Flop-Flop 80 in response to the set terminal (S) of the RS Flip-Flop 80 is set by the second frequency divider 70.

After one period (P cycles), the reset terminal (R) of the RS Flip-Flop 80 is reset by the first frequency divider 60, accordingly a logic-low signal is asserted at the output terminal (Q) and the divided value of the dual modulus divider 50 will be back to (N+1) again.

According to the above description, an equation can be derived from the fractional-N PLL depicted in FIG. 1A $$F_{vco}=[(N+1)S+N(P-S)]F_{ref}$$

which can be written as $$\frac{F_{vco}}{F_{ref}} = \left(P + \frac{S}{N}\right) \cdot N$$

in other words, the equivalent divided value of the frequency dividing unit 45 is $$\left(P + \frac{S}{N}\right) \cdot N.$$

Figure 1B:
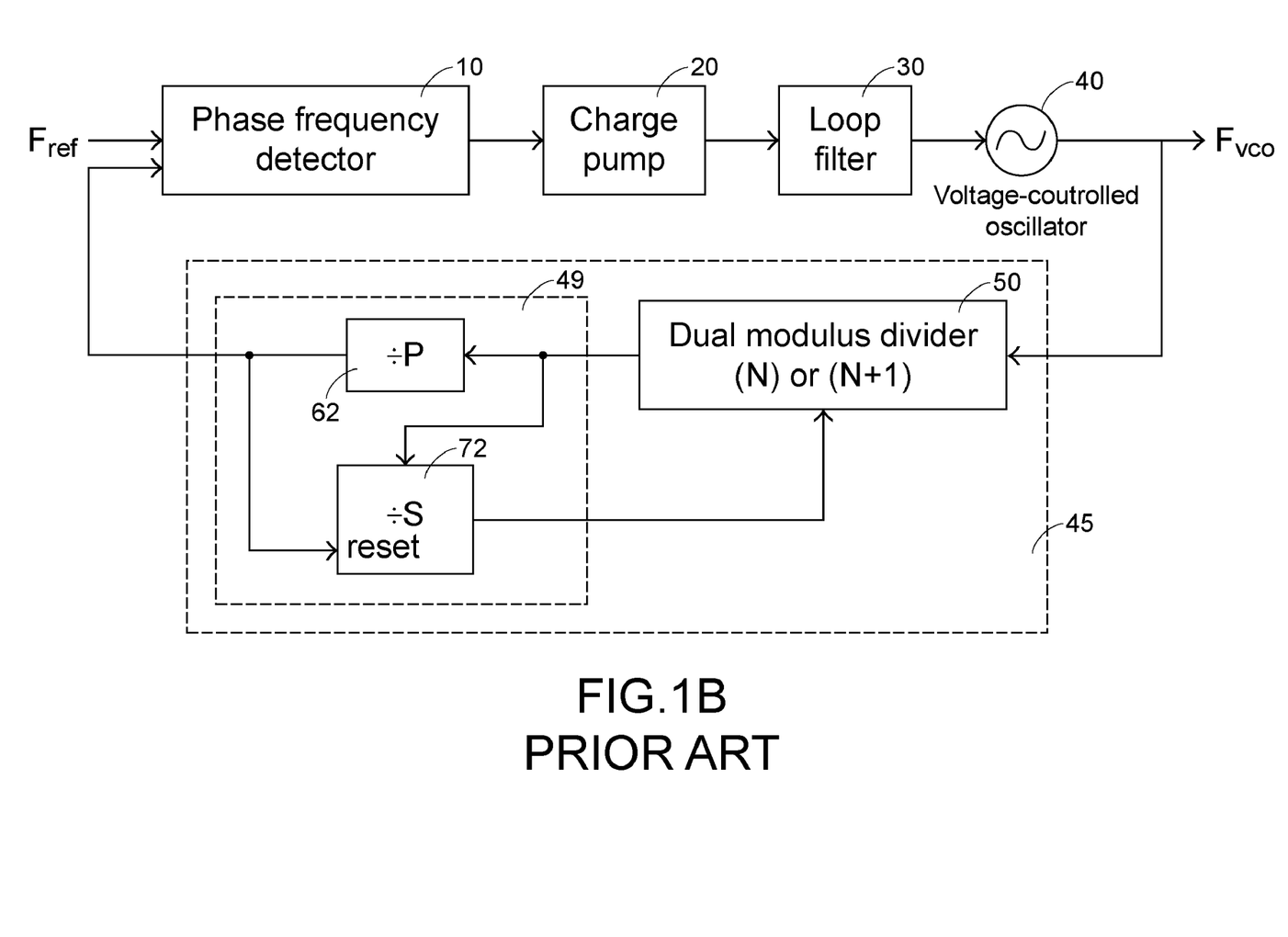
FIG. 1B is a schematic diagram showing the circuit configuration of another conventional fractional-N PLL.

The frequency dividing circuit 48 in FIG. 1A can be implemented by two frequency dividers only. FIG. 1B is a schematic diagram showing the circuit configuration of another conventional fractional-N PLL, wherein the frequency dividing circuit 49 includes a first frequency divider 62 and a second frequency divider 72. Similarly, if one period includes P cycles (cycle number 1 to cycle number P) in the signal derived from the dual modulus divider 50, the divided value of the dual modulus divider 50 will be (N+1) between the cycle number 1 to cycle number S (when the second frequency divider 72 counts to S) due to a logic-low signal is derived from the second frequency divider 72 and further inputted to the control terminal of the dual modulus divider 50; the divided value of the dual modulus divider 50 will be N between the cycle number (S+1) and cycle number P (after the second frequency divider 72 counts to S) due to a logic-high signal is derived from the second frequency divider 72 and further inputted to the control terminal of the dual modulus divider 50; the reset terminal (reset) of the second frequency divider 72 is reset by the first frequency divider 62 in the cycle number P (one period), and the divided value of the dual modulus divider 50 will be back to (N+1) again.

According to the above description, an equation can be derived from the fractional-N PLL depicted in FIG. 1B $$\frac{F_{vco}}{F_{ref}} = \left(P + \frac{S}{N}\right) \cdot N$$

in other words, the equivalent divided value of the frequency-dividing unit 45 is $$\left(P + \frac{S}{N}\right) \cdot N.$$

Furthermore, the voltage-controlled frequency $F_{vco}$ of voltage-controlled output signal can be further controlled by changing the divided value S of the second divider 70 and 72 in FIG. 1A and FIG. 1B. And, This kind of fractional-N PLL is called a spread spectrum clock generator.

Figure 2:
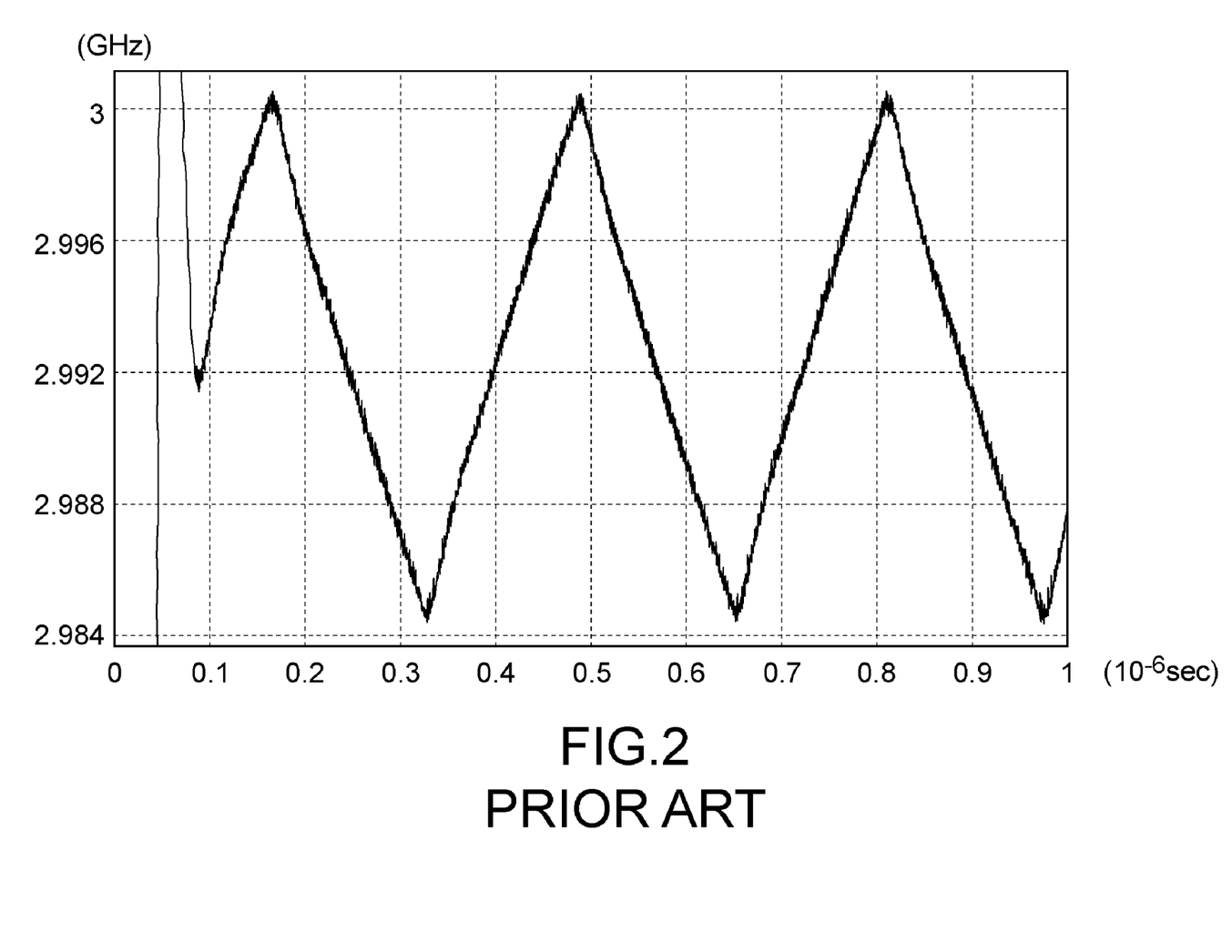
FIG. 2 is a diagram showing the voltage-controlled frequency $F_{vco}$ of the voltage-controlled signal in a prior-art spread spectrum clock generator.

FIG. 2 is a diagram showing the voltage-controlled frequency $F_{vco}$ of the voltage-controlled signal in a prior-art spread spectrum clock generator. Because the divided value is an integer N or (N+1) in the dual modulus divider 50, the phase jump of the voltage-controlled output signal must be a multiple of 360 degree when the voltage-controlled frequency $F_{vco}$ changes. In other words, the voltage-controlled frequency $F_{vco}$ has a relatively poor accuracy; accordingly the spread spectrum clock generator has a relatively high jitter value. Furthermore, the spread spectrum clock generator with the above-mentioned structure has a relatively poor resolution, for instance, the voltage-controlled frequency $F_{vco}$ cannot be accurately controlled when the spread spectrum clock generator is operated at 3 GHz and has 2500 ppm spread frequency. Therefore, providing a spread spectrum clock generator having a relatively high accuracy of voltage-controlled frequency and a relatively low jitter value is the main purpose of the present invention.

SUMMARY OF THE INVENTION

Therefore, the object of the present invention is to provide a spread spectrum clock generator with a relatively high accuracy in the voltage-controlled frequency and a relatively low jitter value.

The present invention provides a spread spectrum clock generator, comprising: a phase frequency detector, for generating a phase difference signal according to a frequency divided signal and a reference signal with a reference frequency; a charge pump, for receiving the phase difference signal and generating an output current according to the phase difference signal; a loop filter, for receiving the output current and converting the output current to a voltage-controlled signal; a voltage-controlled oscillator, for receiving the voltage-controlled signal and generating a plurality of voltage-controlled output signals, wherein the plurality of voltage-controlled signals have a specific phase difference and a same voltage-controlled frequency; a frequency dividing unit, for receiving the plurality of voltage-controlled output signal and generating the frequency divided signal; and, a delta-sigma modulator, for controlling the frequency dividing unit to have an equivalent divided value of (N+b) S+(N−a)(P−S) through receiving the frequency divided signal and a control word; wherein N, P, and S are integers, and a, b are fractional numbers, and S can be adjusted by the delta-sigma modulator.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 3:
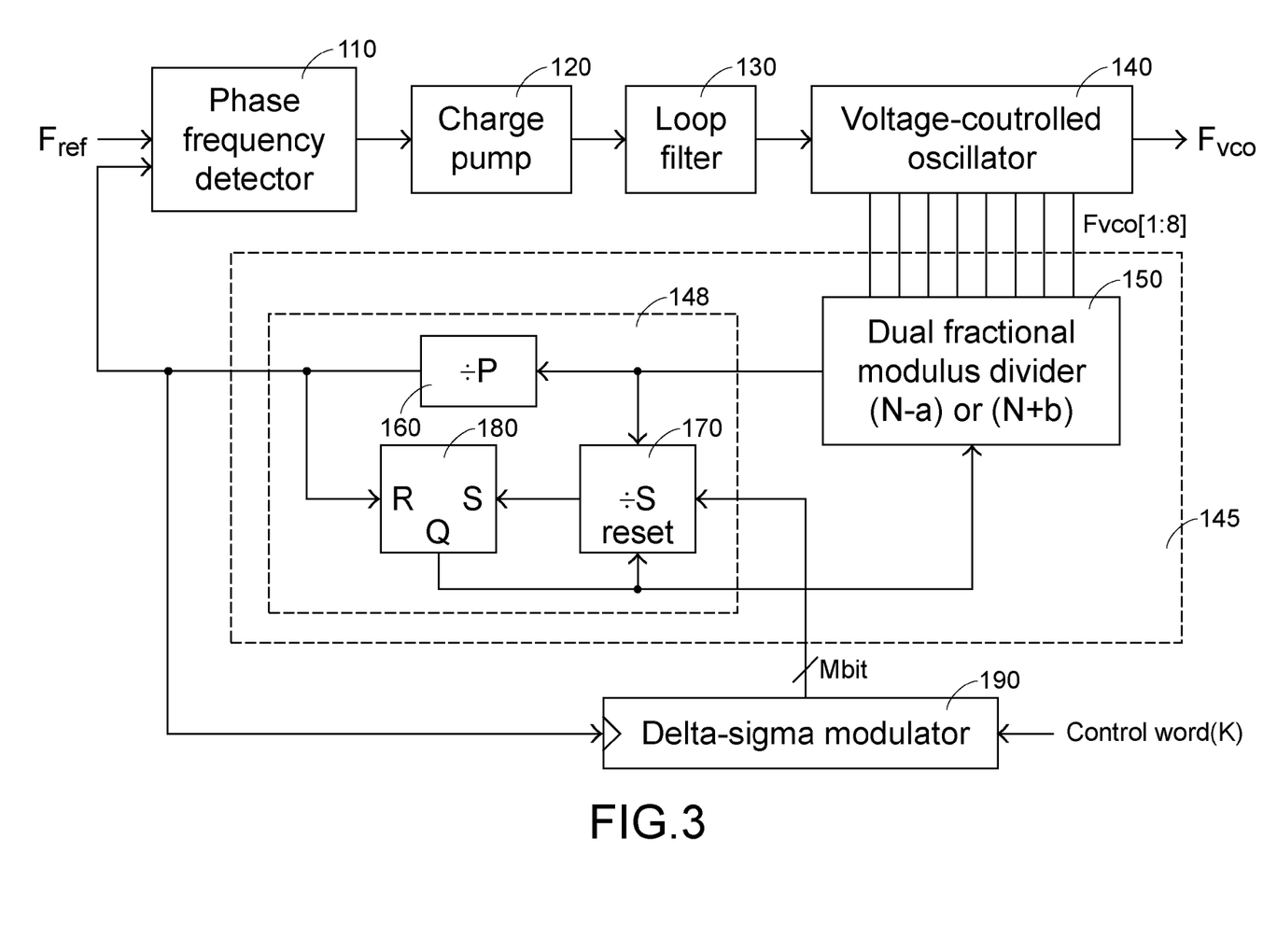
FIG. 3 is a schematic diagram showing the circuit configuration of the spread spectrum clock generator of the present invention.

FIG. 3 is a schematic diagram showing the circuit configuration of the spread spectrum clock generator of the present invention. The spread spectrum clock generator includes: a phase frequency detector 110, a charge pump 120, a loop filter 130, a voltage-controlled oscillator 140, a frequency dividing unit 145, and a delta-sigma modulator 190.

Firstly, a reference signal with a reference frequency $F_{ref}$ is derived from a reference oscillator (not shown). The reference signal and a frequency divided signal, derived from frequency dividing unit 145, are simultaneously inputted to the phase frequency detector 110. A phase difference signal is derived from the phase frequency detector 110 in response to the phase frequency detector 110 detecting the differences of the phase and frequency between the reference signal and the frequency divided signal, and the phase difference signal is further inputted to the charge pump 120. An output current is derived from the charge pump 120 in response to the magnitude of the phase difference signal, and the output current is further inputted to the loop filter 130. The output current is smoothed by the loop filter 130 and converted to a voltage-controlled signal, and the voltage-controlled signal is further inputted to the voltage-controlled oscillator 140. A plurality of voltage-controlled output signals, with a fixed phase difference and a voltage-controlled frequency $F_{vco}$, are generated and derived from the voltage-controlled oscillator 140 in response to the voltage-controlled signal. There are eight voltage-controlled output signals $F_{vco}[1:8]$ in the embodiment of the present invention, and the eight voltage-controlled output signals $F_{vco}[1:8]$ have phases 0, 45, 90, 135, 180, 225, 270, 315 degree, respectively.

The frequency dividing unit 145 further includes: a dual fractional modulus divider 150 and a frequency dividing circuit 148. The frequency dividing circuit 148 further includes: a first frequency divider 160, a second frequency divider 170, and a RS Flip-Flop 180. The dual fractional modulus divider 150 functions to receive the plurality of voltage-controlled output signal $F_{vco}[1:8]$ with a voltage-controlled frequency $F_{vco}$ and divide the voltage-controlled frequency $F_{vco}$ by (N−a) or (N+b) according to the signal asserted at the control terminal of the dual fractional modulus divider 150, wherein N is an integer and a, b are fractional numbers. The control terminal of the dual fractional modulus divider 150 is connected to an output terminal (Q) of the RS Flip-Flop 180, in other words, the divided value selected by the dual fractional modulus divider 150 for dividing the voltage-controlled frequency $F_{vco}$ is determined by the logic level of the signal derived from the output terminal (Q) of the RS Flip-Flop 180. The signal derived from the dual fractional modulus divider 150 is inputted to both the first frequency divider 160 and the second frequency divider 170 in the frequency dividing circuit 148. The first frequency divider 160 functions to divide the frequency of the signal derived from the dual fractional modulus divider 150 by P, then generates and outputs the frequency divided signal to the reset terminal (R) of the RS Flip-Flop 180; the second frequency divider 170 functions to divide the frequency of the signal derived from the dual fractional modulus divider 150 by S, then generates and outputs the frequency divided signal to the set terminal (S) of the RS Flip-Flop 180; wherein P, S are integers and P is greater than S. The output terminal (Q) of the RS Flip-Flop 180 is connected to the reset terminal (reset) of the second frequency divider 170. Therefore, the equivalent divided value of the frequency-dividing unit 145 is (N+b)S+(N−a)(P−S).

In the embodiment of the present invention, the size of the delta-sigma modulator 190 is M bits, and the control word received by the delta-sigma modulator 190 is K. The frequency divided signal, derived from the frequency dividing unit 145, is inputted to the clock terminal of the delta-sigma modulator 190, and the value derived from the output terminal of the delta-sigma modulator 190 is the divided value S of the second frequency divider 170. Therefore, the equivalent divided value between the voltage-controlled frequency $F_{vco}$ and the reference frequency $F_{ref}$ of the spread spectrum clock generator of the present invention is $$\frac{F_{vco}}{F_{ref}} = \bar{n} + \frac{K}{2^M} \cdot \frac{\phi_{step}}{2}$$

where $\bar{n}$ is the average value of division ratio of the frequency dividing unit 145; $\phi_{step}$ is the phase jump value; K is the control word of the delta-sigma modulator 190; M is the size of the delta-sigma modulator 190.

In the embodiment of the present invention, the voltage-controlled frequency $F_{vco}$ of the spread spectrum clock generator of the present invention is operated in the range of 2.985 GHz~3 GHz, and the reference frequency $F_{ref}$ is 50 MHz, therefore, the equivalent divided value of the frequency dividing unit 145 is in the range of 59.7~60.

In one case, if the divided value of the frequency dividing unit 145 is 60 when the control word of the delta-sigma modulator 190 is K1; the divided value of the frequency dividing unit 145 is 59.7 when the control word of the delta-sigma modulator 190 is K2, therefore:

$$\bar{n} + \frac{K1}{2^M} \cdot \frac{\phi_{step}}{2} = 60 \quad (1)$$

$$\bar{n} + \frac{K2}{2^M} \cdot \frac{\phi_{step}}{2} = 59.7 \quad (2)$$

$$\left(\frac{K1}{2^M} - \frac{K2}{2^M}\right) \cdot \frac{\phi_{step}}{2} = 0.3 \quad (3)$$

Because $$-1 \le \frac{K1}{2^M} \le +1,$$

and $$-1 \le \frac{K2}{2^M} \le +1,$$

therefore:

$$\left|\left(\frac{K1}{2^M} - \frac{K2}{2^M}\right)\right| \le 2 \quad (4)$$

$\phi_{step} \ge 0.3$ is derived from the equations (3) and (4).

In other words, the delta-sigma modulator 190 will be operated in the bounding edge if $\phi_{step}$ is selected to 0.3, accordingly the distortion may be resulted. Therefore, the ideal $\phi_{step}$ is selected to slightly greater than 0.3.

In the embodiment of the present invention, the divided values (N−a) and (N+b) of the dual fractional modulus divider 150 must satisfy the equation: [(N+b)−(N−a)]>0.3 if the $\phi_{step}$ is selected to be slightly greater than 0.3. Therefore, 'a' is selected to be ⅛ and 'b' is selected to be ⅔ in the embodiment, where b+a=⅜>0.3. In other words, the divided values of the dual fractional modulus divider 150 are (N−⅛) and (N+2/8).

In the embodiment of the present invention, N is selected to be 4, P is selected to be 15, and S is selected among 1~8 derived from the delta-sigma modulator 190; therefore, $\bar{n}$ is 59.8125.

Figure 4:
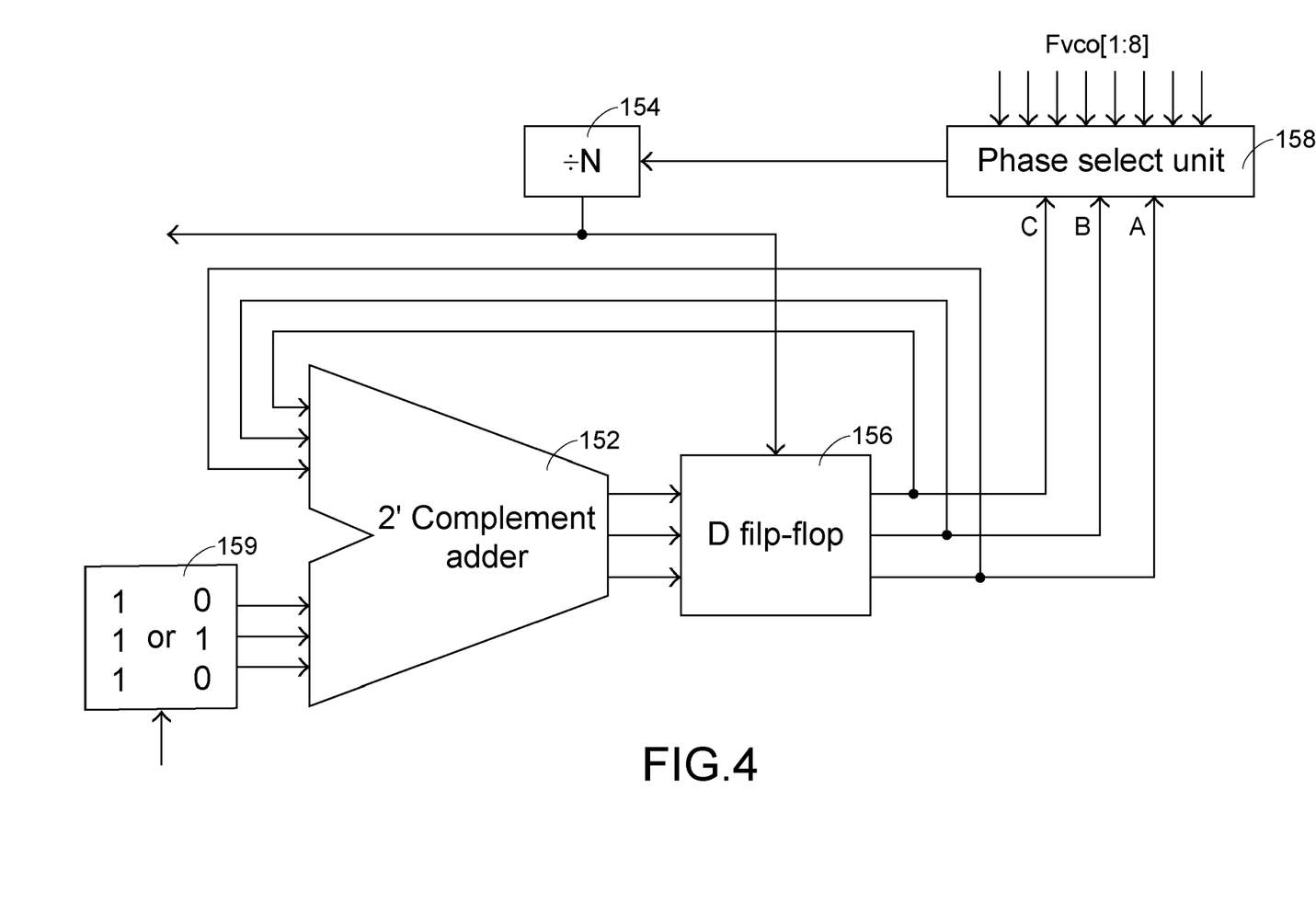
FIG. 4 is a schematic diagram showing the circuit configuration of the dual fractional modulus divider of the present invention.

FIG. 4 is a schematic diagram showing the circuit configuration of the dual fractional modulus divider of the present invention. The dual fractional modulus divider 150 includes: a 2'Complement adder 152, a third frequency divider 154, a D Flip-Flop 156, a phase select unit 158, and a value control unit 159.

Firstly, the eight voltage-controlled output signals $F_{vco}$[1:8], derived from the voltage-controlled oscillator, are input to the phase select unit 158, and one of these eight voltage-controlled output signals $F_{vco}$[1:8] is selected and inputted to the third frequency divider 154. The third frequency divider 154 functions to divide the frequency of the selected $F_{vco}$ by N. The signal derived from the third frequency divider 154 is the output signal of the dual fractional modulus divider 150, and the signal is also inputted to the clock terminal of the D Flip-Flop 156. The control terminal of the value control unit 159 is the control terminal of the dual fractional modulus divider 150, that is, when the signal asserted at the control terminal is at a first level (i.e., logic-high level), "111" is derived from the value control unit 159 to the first input terminal of the 2'Complement adder 152; alternatively, when the signal asserted at the control terminal is at a second level (i.e., logic-low level), "010" is derived from the value control unit 159 to the first input terminal of the 2'Complement adder 152, wherein "111" is referred as −1, and "010" is referred as +2. The add-sum output terminal of the 2'Complement adder 152 is connected to the input terminal of the D Flip-Flop 156; the output terminal of the D Flip-Flop 156 is connected to the second input terminal of the 2'Complement adder 152 and the phase select unit 158. It is understood that the value derived from the value control unit 159 is changeable, and the value derived from the value control unit 159 is not limit in the present invention, accordingly.

When the signal asserted at the control terminal of the D Flip-Flop 156 is at the first level, the value derived from the output terminal of the D Flip-Flop 156 is periodically decreased by 1 according to the signal asserted at the clock terminal, accordingly, one of the eight voltage-controlled output signals $F_{vco}$[1:8] is sequentially selected by the phase select 158 from the backward direction. In other words, the voltage-controlled output signals $F_{vco}$[8], $F_{vco}$[7], $F_{vco}$[6], $F_{vco}$[5], $F_{vco}$[4], $F_{vco}$[3], $F_{vco}$[2], $F_{vco}$[1], $F_{vco}$[8], $F_{vco}$[7] ... are sequentially selected and derived from the phase select unit 158. The voltage-controlled signal inputted to the third frequency divider 154 is divided by N, and then derived from the third frequency divider 154. That is, the divided value of the dual fractional modulus divider 150 is (N−⅛).

Similarly, when the signal asserted at the control terminal of the D Flip-Flop 156 is at the second level, the value derived from the output terminal of the D Flip-Flop 156 is periodically increased by 2 according to the signal asserted at the clock terminal, accordingly, one of the eight voltage-controlled output signals $F_{vco}$[1:8] is sequentially selected by the phase select 158 from the forward direction. In other words, the voltage-controlled output signals $F_{vco}$[1], $F_{vco}$[3], $F_{vco}$[5], $F_{vco}$[7], $F_{vco}$[1], $F_{vco}$[3] ... or, the voltage-controlled output signals $F_{vco}[2]$, $F_{vco}[4]$, $F_{vco}[6]$, $F_{vco}[8]$, $F_{vco}[2]$, $F_{vco}[4]$ ... are sequentially selected and derived from the phase select unit 158. The voltage-controlled signal inputted to the third frequency divider 154 is divided by N, and then derived from the third frequency divider 154. That is, the divided value of the dual fractional modulus divider 150 is (N+⅖).

Figure 5:
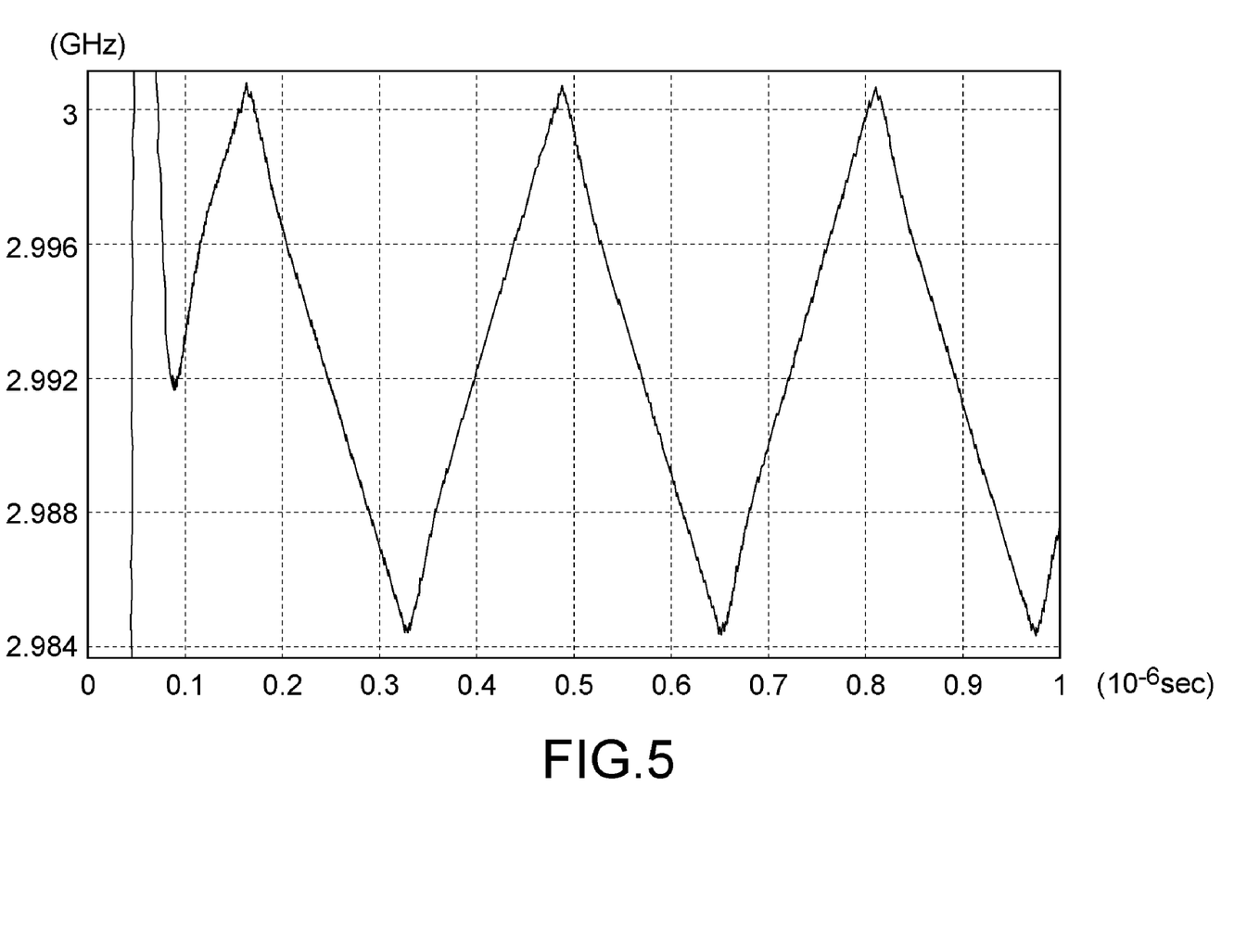
FIG. 5 is a diagram showing a voltage-controlled signal of a voltage-controlled frequency $F_{vco}$ of the present invention.

FIG. 5 is a diagram showing a voltage-controlled signal of a voltage-controlled frequency $F_{vco}$ of the present invention. Because the divided values in the dual fractional modulus divider 150 are fractional numbers (N−⅛) or (N+⅖), the phase jump of the voltage-controlled output signal is down to 135 degree when the voltage-controlled frequency $F_{vco}$ changes. In other words, the voltage-controlled frequency $F_{vco}$ in the present invention has a relatively higher accuracy, accordingly the spread spectrum clock generator of the present invention has a relatively low jitter value. Furthermore, the spread spectrum clock generator of the present invention has a relatively high resolution, that is, the voltage-controlled frequency $F_{vco}$ derived from the spread spectrum clock generator of the present invention can be controlled accurately.

The spread spectrum clock generator of the present invention can be implemented with a frequency multiplier if necessary. For example, the frequency of the $F_{vco}$ derived from the voltage-controlled oscillator 140 (depicted in FIG. 3) can be multiplied by 2 if a frequency multiplier having a multiplied value 2 is implemented. The original $F_{vco}$ (3 GHz, 2500 ppm) can be multiplied to (6 GHz, 5000 ppm).

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A spread spectrum clock generator, comprising:
a phase frequency detector, for generating a phase difference signal according to a frequency divided signal and a reference signal with a reference frequency;
a charge pump, for receiving the phase difference signal and generating an output current according to the phase difference signal;
a loop filter, for receiving the output current and converting the output current to a voltage-controlled signal;
a voltage-controlled oscillator, for receiving the voltage-controlled signal and generating a plurality of voltage-controlled output signals, wherein the plurality of voltage-controlled output signals have a specific phase difference and a same voltage-controlled frequency;
a dual fractional modulus divider, for receiving the plurality of voltage-controlled output signals and a control signal, and generating a first signal though dividing the voltage-controlled frequency by (N−a) or (N+b);
a frequency dividing circuit, for receiving the first signal and generating the frequency divided signal to the phase frequency detector and the control signal to the dual fractional modulus divider; and
a delta-sigma modulator, for controlling the frequency dividing circuit and the dual fractional modulus divider to have an equivalent divided value of (N+b)S+(N−a)(P−S) though receiving the frequency divided signal and a control word;
wherein N, P, and S are integers, and a, b are fractional numbers, and S can be adjusted by the delta-sigma modulator.

2. The spread spectrum clock generator according to claim 1, wherein the frequency dividing circuit further comprises:
a first frequency divider, for receiving the first signal and generating the frequency divided signal though dividing the frequency of the first signal by integer P;
a second frequency divider, for receiving the first signal and generating a second signal though dividing the frequency of the first signal by integer S; and
a RS Flip-Flop having a set terminal, a reset terminal, and an output terminal, wherein the set terminal is for receiving the second signal, the reset terminal is for receiving the frequency divided signal, the signal asserted at the output terminal is the control signal of the dual fractional modulus divider.

3. The spread spectrum clock generator according to claim 2, wherein the first frequency divider is a program counter, the second frequency divider is a swallow counter.

4. The spread spectrum clock generator according to claim 2, wherein the delta-sigma modulator is connected to the second frequency divider and functions for adjusting the value S.

5. The spread spectrum clock generator according to claim 1, wherein the frequency dividing circuit further comprises:
a program counter, for receiving the first signal and outputting the frequency divided signal, wherein the program counter can count the first signal to make the frequency of the first signal P times of the frequency of the frequency divided signal; and
a swallow counter, for receiving and counting the first signal, wherein the swallow output a first level serving as the control signal before the first signal is counted to S, the swallow output a second level serving as the control signal after the first signal is counted to S;
wherein the swallow counter is reset and the first level is derived from the swallow counter when the first signal is counted to P by the program counter.

6. The spread spectrum clock generator according to claim 5, wherein the delta-sigma modulator is connected to the second frequency divider and functions for adjusting the value S.

7. The spread spectrum clock generator according to claim 1, wherein the dual fractional modulus divider further comprises:
a value control unit, for providing a first value or a second value according to the control signal;
a 2'Complement adder having a first input terminal, a second input terminal, and an add-sum output terminal, wherein the first input terminal is for receiving the first value or the second value derived from the value control unit;
a D Flip-Flop having a clock terminal, an input terminal, and an output terminal, wherein the clock terminal is for receiving the first signal, the input terminal is connected to the add-sum output terminal of the 2'Complement adder, the output terminal is connected to the second input terminal of the 2'Complement adder;
a phase select unit connected to the output terminal of the D Flip-Flop, for selecting one of the plurality of voltage-controlled output signal and outputting the selected voltage-controlled output signal according to the value derived from the output terminal of the D Flip-Flop; and
a third frequency divider, for receiving the voltage-controlled output signal derived from the phase select unit, and converting the voltage-controlled output signal to the first signal though dividing the frequency of the voltage-controlled output signal by N.

* * * * *